United States Patent
Grenon et al.

[11] Patent Number: 6,156,461
[45] Date of Patent: Dec. 5, 2000

[54] METHOD FOR REPAIR OF PHOTOMASKS

[75] Inventors: Brian J. Grenon, Colchester, Vt.;
Richard A. Haight, Mahopac, N.Y.;
Dennis M. Hayden, Essex Junction, Vt.; Michael S. Hibbs, Westford, Vt.;
J. Peter Levin, Winooski, Vt.; Timothy E. Neary, Essex Junction, Vt.;
Raymond E. Rochefort; Dennis A. Schmidt, both of South Burlington, Vt.;
Jacek G. Smolinski, Jericho, Vt.;
Alfred Wagner, Brewster, N.Y.

[73] Assignee: International Business Machines Corporation, Armonk, N.Y.

[21] Appl. No.: 09/504,031

[22] Filed: Feb. 14, 2000

Related U.S. Application Data

[62] Division of application No. 08/786,061, Jan. 21, 1997.

[51] Int. Cl.[7] .................................................. G03S 9/00
[52] U.S. Cl. .......................... 430/5; 430/311; 204/192.34
[58] Field of Search ................................ 430/5, 311, 313, 430/314; 204/192.34, 298.36

[56] References Cited

PUBLICATIONS

"Sub–picosecond UV Laser Ablation of Metals," Applied Physics A (Materials Science Processing), Jul. 1995, Germany, vol. D61, No. 1, pp. 33–37, XP002080958 ISSN 0947–8396).

*Primary Examiner*—S. Rosasco
*Attorney, Agent, or Firm*—James M. Leas

[57] ABSTRACT

A method of repairing defects on masks includes the step of providing a coating on the mask to prevent damage to clear regions of the mask from laser ablation splatter, laser ablation caused quartz pitting, laser deposition staining, and FIB caused gallium staining. The coating is a metal, a polymer, or a carbon material. The coating is formed on clear regions of the mask as well as either over or under the light absorbing material of the mask. A coating comprising a thin copper layer significantly improves imaging with the ion beam while protecting clear regions of the mask from FIB stain. A coating formed of a photosensitive polymer is used to etch opaque defects. While wanted opaque regions adjacent an opaque defect are also etched in this etch step, these created clear defects are then repaired in a subsequent FIB deposition step while a copper coating protects adjacent clear regions from FIB stain. In another embodiment, opaque defects are repaired with a short pulse duration laser without damage to underlying quartz or adjacent clear regions while avoiding the need for a coating.

11 Claims, 6 Drawing Sheets

METHOD FOR REPAIR OF PHOTOMASKS

This application is a division of Ser. No. 08/786,061 filed Jan. 21, 1997.

FIELD OF THE INVENTION

This invention generally relates to a method of repairing defects in photomasks. More particularly, it relates to the use of a coating on a photomask during steps to repair clear and opaque defects on photomasks. It also relates to the use of short duration laser pulses to repair opaque defects on photomasks.

BACKGROUND OF THE INVENTION

Photomasks are extensively used in the fabrication of integrated circuits on semiconductor wafers. Standard photomasks include a patterned absorbing or opaque film on a transparent substrate. A metal such as chromium, having a thickness on the order of about 1000 Å is often used as the opaque film. Nickel and aluminum are also used. A transparent material, such as quartz, is often used as the substrate, though materials such as glass and sapphire can also be used. Phase shift photomasks may include in addition to patterned chromium on quartz, means to change the phase of light near the chromium edge, such as an etched region in the quartz or a transparent layer on the quartz near a chromium edge. Phase shift photomasks can also include, instead of a totally opaque material, an absorbing material, also called an attenuator, that permits transmission of a small fraction of the light.

The fabrication of photomasks usually involves a blanket deposition of a thin film of the chromium opaque film on the quartz substrate. The chromium is then coated with photoresist, which is exposed with a high resolution technique, such as an electron beam, and developed to form the desired pattern in the resist. This pattern is then transferred into the chromium by etching, leaving opaque and transparent regions on the mask.

Figure 1A:
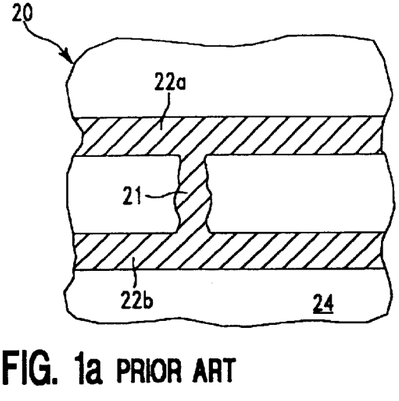
FIGS. 1a–1f are top views of six types of mask defects known in the prior art.
Figure 1B:
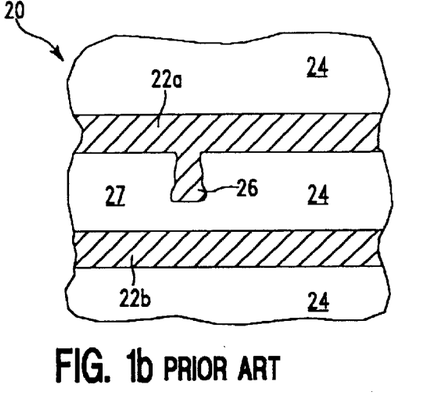
Figure 1C:
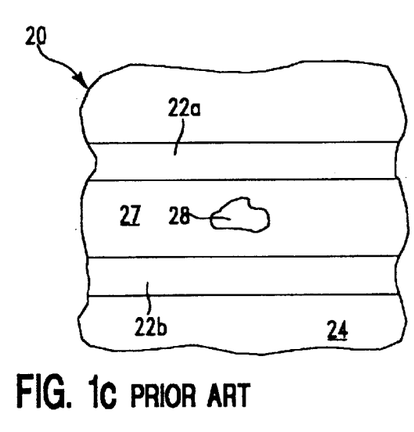
Figure 1D:
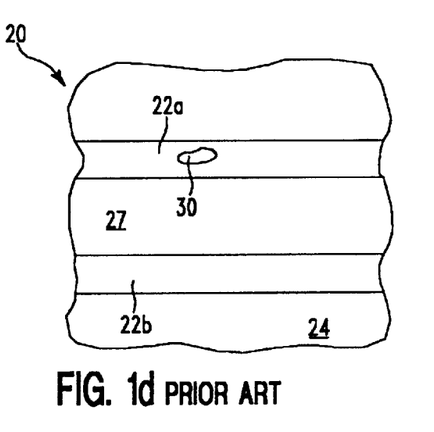
Figure 1E:
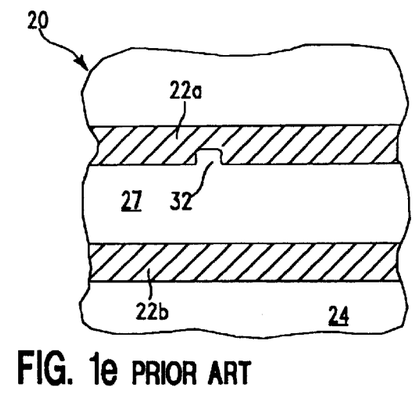
Figure 1F:
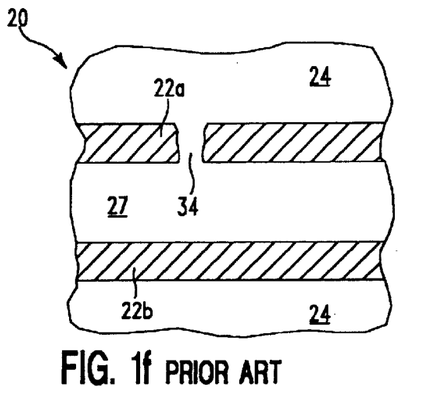

The photomask manufacturing process usually has imperfections, and defects are therefore frequently encountered during inspection of the photomasks. Defects are categorized as either "clear defects," or "opaque defects." Clear defects are regions that are designed to have the chromium but which actually do not have chromium. Opaque defects are regions that are designed to be clear of chromium but which actually do have chromium. FIG. 1 illustrates six of the most common defects seen on photolithography masks: FIG. 1a shows mask 20 having opaque bridge 21 between chromium lines 22a and 22b on quartz substrate 24; FIG. 1b shows opaque extension 26 extending from line 22a into transparent region 27 between lines 22a and 22b; FIG. 1c shows isolated opaque spot 28 in transparent region 27; FIG. 1d shows pinhole 30 in line 22a; FIG. 1e shows clear extension 32 into line 22a; and FIG. 1f shows clear bridge 34 extending across line 22a.

Masks having sufficiently large structures can be repaired using a technique described in U.S. Pat. No. 3,748,975, to Tarabocchia, in which photoresist is applied to the mask and exposed in a rectangular region including the defect to either open up a window for etching opaque defects away or to leave a region of tinted negative photoresist to fill in clear defects. However, for opaque and clear defects that are attached to metal lines normal process variations in the exposure, develop, and etch steps are too great to remove just the required amount of defect and provide a line having the desired shape within the tolerance required of present and future masks. For example, masks are currently being generated with lines having a width of 0.3 um that typically have a tolerance in that width in the range 10% or, more preferably, 5%. This precision is not achievable with standard photolithographic techniques, and the repair is likely either to leave unwanted material on the mask or to remove wanted material from the adjacent opaque region. Thus, present masks have been repaired using highly focused beams of photons or ions.

More specifically, opaque defect repair currently involves laser evaporation or ablation or focused ion beam (FIB) sputtering of the unwanted chromium in defect regions such as opaque bridge 21, opaque extension 26, and opaque spot 28. However, as with photolithographic processes, because the resolution of a laser is limited, if the opaque defect is connected to an adjacent chromium line (as in FIGS. 1a and 1b), laser ablation may damage that adjacent line, removing some wanted chromium from the line. In addition, because a great deal of thermal energy is transmitted with the laser beam, the laser ablation step not only melts and vaporizes the unwanted metal defect region, it also damages and removes a layer of quartz underlying and adjacent the opaque defect, producing roughness in the quartz, as described in a paper "Effect of Laser Mask Repair Induced Residue and Quartz Damage in Sub-half-micron DUV Wafer Process," by Peiyang Yan, et al., *Proceedings of the 15th Annual Symposium on Photomask Technology and Management,* Sep. 20–22, 1995, SPIE Volume 2621, p. 158–166. This damaged region of the quartz is also responsible for reduced transmission and altered phase of transmitted light.

As an alternative to laser ablation, FIB offers a very controlled process for sputtering a small region of unwanted material. The ion beam can be focused to a much smaller size than the laser beam. In addition, the ion beam physically sputters material, transmitting very little thermal energy to the mask; thus, the quartz is not pitted. However, there are several problems that limit the use of FIB for mask repair. First, because masks are formed on quartz substrates, an insulating material, the ion beam rapidly charges the surface, and both the ability to aim subsequent ions and to use the ion beam to image the results is degraded. Second, while an opaque defect is being removed, quartz at the edge of the defect is attacked at the same rate, and the result is a "river bed" or trench of damaged quartz around the defect, the quartz in this region having altered transmission and phase. Third, the focused ion beam species is typically gallium, and gallium has been found implanted into the quartz when the opaque defect is removed, causing transmission losses. Fourth, the sputtering of material by the ion beam leads to ejection of material in all directions, and some of this ejected material comes to rest on adjacent edges as described in an article by J. M. E. Harper, et al., "Method for Improving Resolution of Focused Ion Beam Mask Repair Process," *IBM TDB,* n10a, March, 1991, p174–176.

Clear defects can be repaired using a beam stimulated deposition process such as laser deposition or focused ion beam (FIB) induced deposition. These processes typically involve the decomposition of volatile organometallic complexes for which decomposition can be induced by the beam. Mask repair systems for laser deposition and FIB deposition have been commercially available for many years and the processes are well known in the art. However, inventors of the present invention have found that a thin halo of deposited material is found adjacent the laser repaired region. The halo is the result of deposition along the periphery of the laser spot where there is a low but non negligible light intensity.

Thus, the edges of laser deposited material are difficult to control and trimming is usually required. This trimming step introduces the same kinds of problems and defects seen when removing other opaque defects.

Similarly, while FIB deposition to repair clear defects is more controllable than laser deposition, because the ion beam current profile also has a long tail which extends well beyond the nominal beam diameter, material is deposited in a relatively large area surrounding the intended deposit, as described in an article "Elimination of Excess Material during Focused Ion Beam Induced Deposition," by P. G. Blauner, IBM Technical Disclosure Bulletin, v 39, n1, January, 1996, p. 287–290. This peripheral film is a fraction of the thickness of the intended deposit, but often must be removed to avoid degradation of transmission in surrounding clear regions. Removal of the peripheral film, or "halo" requires an extra step which adds to the complexity and time required for the repair process and introduces another possibility for damaging the quartz or otherwise introducing defects. In addition, because the quartz substrate charges during ion beam processing, the ion beam can be deflected and the repair patch will therefore not be located where expected.

One proposed clear defect repair technique, described in U.S. Pat. No. 4,200,668, to Segal et al. (the '668 Patent), provides for repairing pin holes in the metal of a photomask by depositing resist on the mask, opening a window exclusively in the region of the pin hole by burning through the resist in that region with a laser, etching in the window to remove additional metal, thereby widening the pinhole and providing a more adhesive surface, depositing an opaque material on the entire surface, and then lifting off the opaque material on the resist, leaving it in the window adhering to the adjacent metal surrounding the pin hole. While this repair process is suitable for isolated pinhole defects, it is not adequate for clear defects at the edge of a metal line that required accurate reshaping and aligning, such as the clear extension and clear bridge of FIGS. 1e and 1f.

Thus, a better solution is needed that provides a more reliable method of correcting opaque and clear defects on photomasks, and this solution is provided by the following invention.

SUMMARY OF THE INVENTION

It is therefore an object of the present invention to provide a method of repairing masks that leaves the mask without repair induced damage.

It is another object of the present invention to provide a method of laser ablating a defect on a mask without causing quartz pitting.

It is another object of the present invention to provide a method of laser ablating a defect on a mask without leaving laser ablation fallout on clear regions of the mask.

It is another object of the present invention to provide a method of FIB sputtering or FIB deposition without staining clear regions of the mask.

It is a feature of the present invention that excellent imaging of chromium, oxide, defect, and repair is achieved in an ion beam.

It is an advantage of the present invention that a mask is repaired without degradation of transmission in the defect region or in the region adjacent thereto.

These and other objects, features, and advantages of the invention are accomplished by a method of repairing a mask having a minimum line width, the method comprising the steps of: providing a transparent substrate comprising a surface having a first region and a second region, a light absorbing first material covering the first region to provide a line, the line having an edge, the edge having an edge placement tolerance of 10% of the minimum line width or less, the second region having a transmittance having a transmittance tolerance of 5% or less; inspecting the mask and detecting a defect, the defect in a defect region, the defect including the edge; repairing the defect, wherein all the second region in the defect region and adjacent the defect region has a transmittance within the transmittance tolerance and wherein the edge in the defect region and adjacent the defect region is within the edge placement tolerance.

BRIEF DESCRIPTION OF THE DRAWINGS

The foregoing and other objects, features, and advantages of the invention will be apparent from the following detailed description of the invention, as illustrated in the accompanying drawings, in which:

FIG. 3d is a cross sectional view after laser ablating to remove a final layer of the opaque defect of FIG. 3a.

DETAILED DESCRIPTION OF THE INVENTION

The present invention provides several process embodiments for repair of opaque and clear defects. In most embodiments described hereinbelow, a coating is used that protects the mask during subsequent repair steps, such as etching, laser ablating, focused ion beam sputtering, laser deposition, or focused ion beam deposition. The coating may be a polymer, such as photoresist, a metal, such as copper, or a material, such as carbon that can be etched selective to mask materials, including chrome lines, quartz, and attenuator. The coating may be deposited on or under chrome lines of the mask. Alternatively, a short duration laser pulse may be used with or without a protective coating to achieve similar results.

Prepositions, such as "on," "over," and "under" are defined with respect to a planar surface of the mask, regardless of the orientation the mask is actually held. A layer is on another layer even if there are intervening layers.

Applicants of the present invention have discovered that laser ablation of opaque defects can cause damage in addition to the damage to adjacent lines and to the quartz that was described hereinabove. Applicants discovered a stain in the neighborhood of laser ablated opaque defects and found that the stain significantly reduced transmission in those regions, particularly when the mask is used for exposure at short wavelengths, such as 248 nm and 365 nm. Applicants then characterized the stain and found it to be a redeposition of laser ablated material that falls back onto the mask as fallout.

The present invention provides processes for repair of opaque defects by directly repairing isolated opaque defects and by converting attached opaque defects into clear defects. The invention also provides processes for repair of clear defects as originally formed on the mask or as formed during opaque defect repair steps.

Applicants will first summarize the various embodiments of the invention before embarking on a detailed description of each embodiment with reference to the drawings. In one embodiment, the mask is coated with a polymeric material, such as photoresist, or with a thin layer of another selectively etchable material, such as aluminum, copper, or titanium. If resist is used, it is exposed with a laser and developed to open a window over opaque defects. Alternatively, the coating can be opened by laser ablation while remaining portions of the coating protect clear regions of the mask from ablation fallout. In either case the opaque defect is then etched in a standard wet or dry etch process. In another alternative, instead of etching the opaque defect, a laser can be used to ablate the opaque defect while the coating continues to protect other portions of the mask from fallout damage.

The coating protects non-defective portions of the mask since laser ablation fallout falls on the coating instead of directly on clear regions of the mask. Also, during a laser deposition process to fill clear defects, any halo from the laser deposition will be lifted off when the coating is etched. A reactive ion etch (RIE) or sputtering step can also be used to remove the halo on the coating before the liftoff step.

In the develop or ablation processes, the coating may inadvertently be opened extending to a region beyond the opaque defect. This does not cause a problem for an unattached opaque defect. But for an attached opaque defect the opened region may include a portion of a wanted line adjacent the attached opaque defect. Once the coating has been removed above or sufficiently close to a line attached to an opaque defect, the subsequent etch or ablation step may remove and damage this line. If the damage is sufficient, the opaque removal step effectively converts the original opaque defect into a clear defect.

Thus, for attached opaque defects another step is frequently needed to repair both created clear defects and original clear defects by depositing material along the desired pattern to rebuild the desired images. A laser deposition or a FIB deposition tool can be used for this rebuilding process. A coating is used during each of these deposition process steps to protect adjacent clear regions of the mask from unwanted deposits. Furthermore, for FIB deposition, the coating is conductive to avoid charging in the ion beam.

In another embodiment of the invention, FIB sputtering is used instead of the laser exposure, develop, ablation, and chemical etching steps described above. A conductive coating is also applied before the FIB sputtering to avoid charging in the ion beam and to avoid gallium staining of adjacent clear regions. Copper and titanium have excellent properties as coatings during either FIB sputtering or FIB deposition steps to prevent charging by the ion beam, to prevent gallium staining of the quartz, and, because of high secondary electron yields, to provide excellent imaging in the ion beam. In addition both metals are easily removed without damaging the chrome or quartz of the mask.

The FIB sputtering step need not remove the entire opaque defect. Preferably, a thin final layer of the defect is left to be removed in a wet etch step, thereby avoiding gallium staining under the opaque defect. Thus, the copper coating prevents staining in regions adjacent to the defect while the defect itself prevents staining under the defect.

In yet another embodiment, instead of providing a coating over the etched mask, a coating, such as carbon, is provided on the transparent mask substrate blank before the chrome absorber is deposited. The chrome etch stops on this layer of carbon. Thus, the carbon is located both on clear regions of the mask between chrome lines and under the chromium. Under the chrome, and therefore under opaque defects, the carbon is ideally located to protect quartz from pitting during laser ablation. Where it is located over clear regions, the carbon also protects from fallout damage during laser ablation. As in the coating processes described hereinabove, the carbon coating is removed from clear regions once repair is complete, lifting off laser ablation fallout. However, in this case, the carbon remains beneath wanted areas of chromium.

Figure 2A:
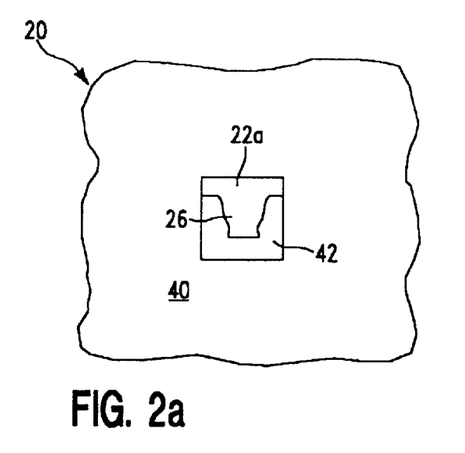
FIGS. 2a–2c are top views of the steps of repairing an opaque defect similar to the defect of FIG. 1b according to an etching embodiment of the present invention.
Figure 2B:
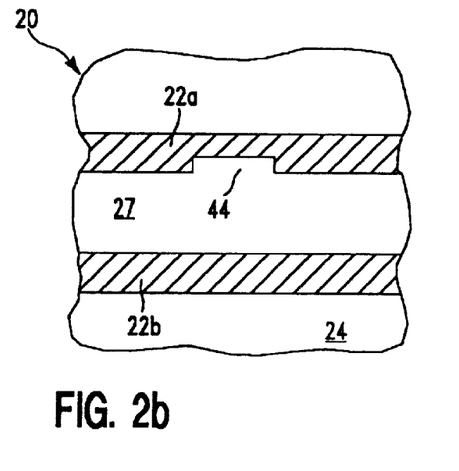
Figure 2C:
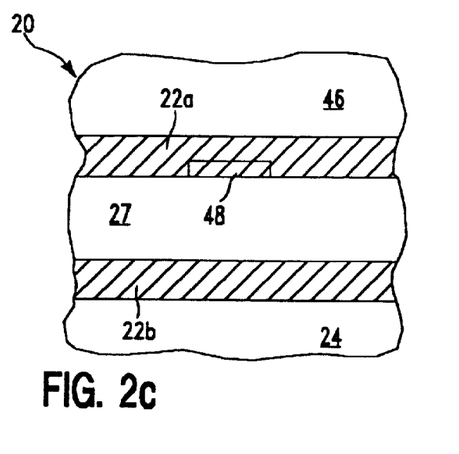

FIGS. 2a–2c show steps in the process of repairing an opaque extension of the type illustrated in FIG 1b. Once defect 26 has been identified (FIG. 1b), quartz substrate 24 is coated with a thin layer of selectively etchable coating 40, such as photoresist, as shown in FIG. 2a, that can later be removed without damaging chromium lines 22a, 22b or quartz substrate 24. If coating 40 is photoresist, it is then exposed and developed to open window 42 in a region including opaque defect 26. A laser is typically used for the exposure to open window 42 in resist coating 40, but any standard source of light or radiation can be used. All opaque defects on the mask are similarly exposed before the development step.

As shown in FIG. 2b, mask 20 is then etched to remove chromium in window 42, including all of opaque defect 26 and portions of adjacent line 22a that happen to be exposed in window 42. Other opaque defects on the mask similarly exposed are also etched. Resist coating 40 is then removed. Thus, opaque defect 26 has been removed without pitting damage to quartz substrate 24 under defect 26 and without fallout damage to adjacent clear regions 27 of substrate 24. But the repair is not yet complete: opaque defect 26 has been converted into clear defect 44 (which is very similar to clear defect 32 of FIG. 1e). Process steps to provide second coating 46, remove clear defect 44, and provide clear defect repair 48, as shown in FIG. 2c, will be described hereinbelow after a description of all opaque defect removal embodiments.

The chromium etch used to remove opaque defect 26 should not attack quartz substrate 24, and appropriate chromium etchants are well known in the art, of both aqueous and plasma etch varieties. Typically cerric ammonium nitrate mixed with an acid, such as nitric, perchloric, or acetic acid is used. Dry etchants include chlorinated hydrocarbons, such as methylene chloride or carbon tetrachloride, and oxygen.

Line 22a typically has an edge having an edge placement tolerance. The exposure, develop, laser ablation, or etch steps described hereinabove can change the shape of line 22a beyond this tolerance as shown in FIG. 2b. Masks having a smallest line width of about 0.3 um and having a edge placement tolerance of 10% of this smallest line width are currently under development. The 10% tolerance is acceptable because an extension defect within the 10% tolerance, that is, extending a distance no more than 10% of the smallest line width on the mask, is unlikely to print as a defect on the semiconductor chip. However, two sided defects, such as the bridge defect illustrated in FIG. 1a, may require a significantly smaller tolerance, such as 5%, to avoid printing on the semiconductor chip.

In one alternative process, coating 40, can be non-photoactive, and a wide range of polymers and thin metal films, including aluminum, copper, or titanium, can be used instead of resist. In this case, a laser may be used to ablate and open window 42 in coating 40 (FIG. 2a) or a photo process can be practised in a photoresist layer applied to the non-photoactive coating 40. While a significantly higher energy is usually needed for ablation of coating 40 than for exposure of photoresist, the energy need not be so high as to damage quartz 24 or to ablate underlying defect 26 or adjacent line 22a. All opaque defect regions on the mask have their coatings subjected to the ablation step or the photomasking step before the mask is etched in the next process step, and all opaque defects are then etched simultaneously.

Figure 3A:
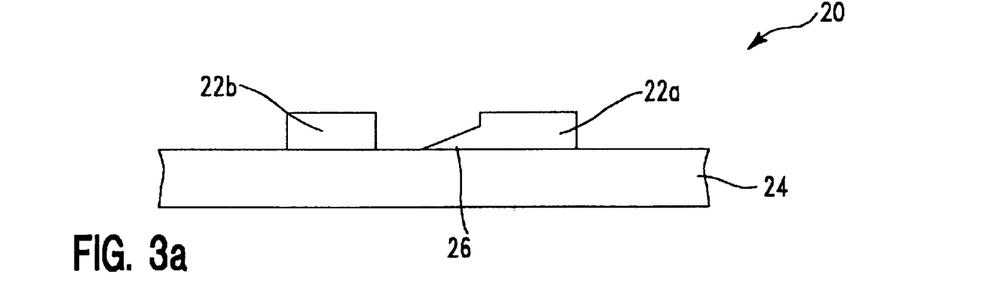
FIGS. 3a is a cross sectional view of the opaque defect of FIG. 1b.
Figure 3B:
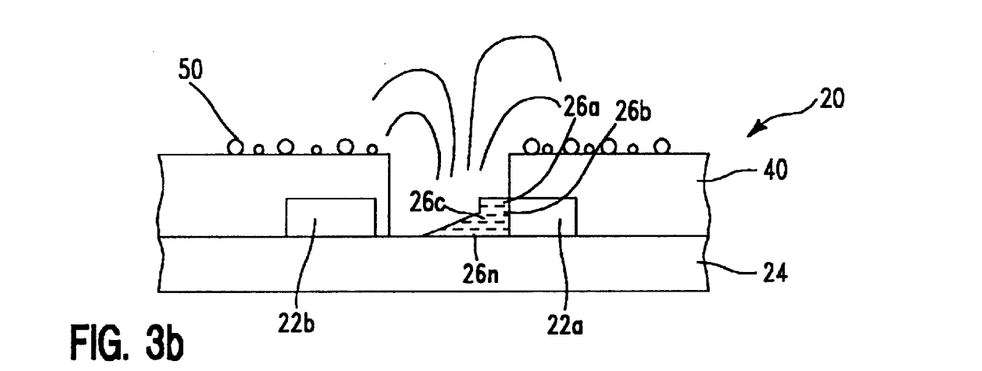
FIG. 3b is a cross sectional view of a step of repairing an opaque defect according to a second embodiment of the present invention by sequentially laser ablating layers of the defect with a short pulse laser.
Figure 3C:
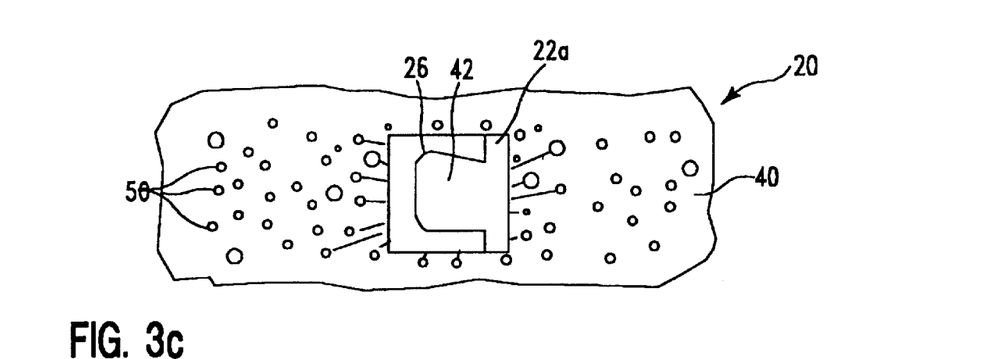
FIG. 3c is a top view of the step of FIG. 3b.
Figure 3D:
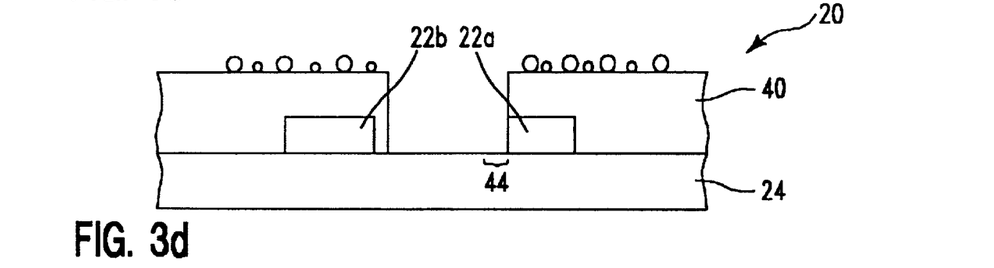

In another alternative process, the entire photomask is coated with protective coating 40. Coating 40 and underlying opaque defect 26 (shown in top view in FIG. 1b and in side view in FIG. 3a) are ablated using a series of short duration laser pulses as illustrated in FIGS. 3b–3d. By suitably adjusting the laser intensity, a fraction of the thickness of coating 40 is removed with each laser pulse. Then repeatedly applying laser pulses, defect 26 is removed one defect layer 26a, 26b, 26c . . . 26n at a time as shown schematically in FIGS. 3b and 3c. The inventors of the present application have used a laser having pulses with a duration less than several picoseconds to ablate coating 40 and defect 26 without damaging any of underlying quartz substrate 24. Thus, they found that a short duration laser pulse can remove opaque defects without pitting or otherwise significantly damaging quartz substrate 24.

As described hereinabove, coating 40 prevents fallout 50, generated from ablated material that redeposits or falls out on mask 20, from damaging clear regions 27 of mask 20 near defect 26; fallout 50 will instead land on coating 40 and be lifted off when coating 40 is later stripped. Fallout has been found not to be a problem in the immediate vicinity of the defect site (such as within window 42 in coating 40) because of the laser energy directed there.

In addition, the present inventors have found that the ablated material is finer and more dispersed when a short duration laser pulse is used as compared to the fallout produced by the current generation of laser ablation tools that have approximately 10 nanosecond duration pulses. The present inventors have also found that fallout 50 on the surface of photomask 20 is substantially less detrimental to clear regions 27 adjacent defect 26, consistent with the finding that the ablated material produced by the short duration laser pulses is finer and more dispersed. They have also found that standard mask cleaning processes are effective to further reduce transmission loss from the finer fallout produced by the short duration laser pulses.

Thus, the present inventors have found that the use of short duration laser pulses eliminates the need for protective coating 40 on photomask 20 during the ablation process step for many mask applications. In one experiment, 2 micro Joules of energy per pulse were focused into a region approximately 5 micrometers in diameter to remove an opaque defect on a conventional chrome-quartz photomask while neither staining adjacent clear areas nor significantly pitting underlying quartz substrate 24. The series of laser pulses had a duration of about 150 femtoseconds and a wavelength of 610 nm and the present inventors were able to completely ablate the defect without a protective coating and achieve greater than 98% optical transmittance at a wavelength of 248 nm under the defect site and in regions neighboring the defect as compared with the optical transmittance in unrepaired clear quartz areas. Thus, the present inventors found an acceptable method of removing opaque defects from a photomask without significantly damaging the clarity of the substrate underlying the defect or in regions neighboring the defect, and without using a coating to protect either the underlying region or the neighboring regions.

In another aspect of the invention, a layer of etchable material (as shown in FIG. 5) is provided under the chrome, preventing any laser pitting damage to the quartz during a conventional single step laser ablation process. The material may be an attenuator layer for a phase shift mask or any of the materials described hereinbelow under the description of FIG. 5.

In addition, laser ablation systems have a standard edge lock to prevent or limit laser ablation of an adjacent wanted line such as line 22a. On some tools the edge lock automatically aligns to the edge of the desired line. In other systems the alignment is done manually by an operator. In the manual system an operator shines a beam of visible light onto the defect to be ablated through a rectangular aperture having controllable length, width, and rotation to provide a spot marker. The operator aligns the edge of the spot marker beam to the edge of the line to within a small tolerance. The laser is then shined through the aperture and ablates in the spot marker region to within a small tolerance. Currently the repair tolerance is in the range of 500 to 1000 Å. This tolerance for the repair is shown in FIGS. 3b and 3c as an exposed portion of line 22a and as clear defect 44 in line 22a in FIG. 3d. Of course, it could also be a small opaque defect extending out from line 22a. Whether a clear repair in region 44 is needed or whether a second ablation step is needed depends on the magnitude of the tolerance and the results of the first ablation. Usually such a repair is not needed because a small "defect" that is within the edge placement tolerance cannot be found by inspection tools and, more importantly, is too small to print on the chip.

Figure 4A:
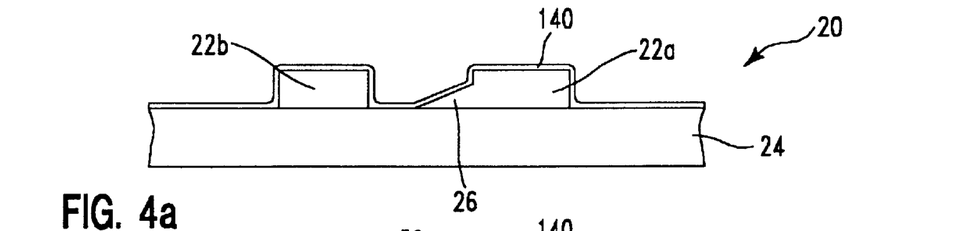
FIGS. 4a–4c and 4e are cross sectional views of steps of repairing an opaque defect similar to the defect of FIG. 1b according to a FIB sputtering embodiment of the present invention.
Figure 4B:
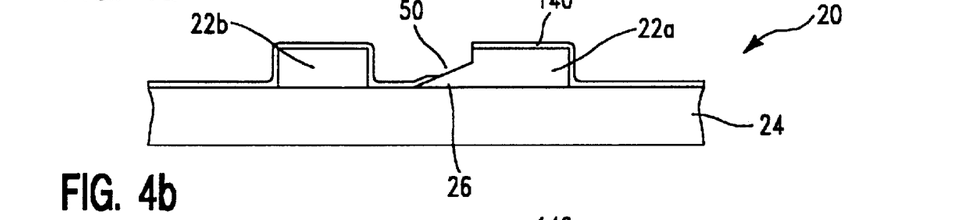
Figure 4C:
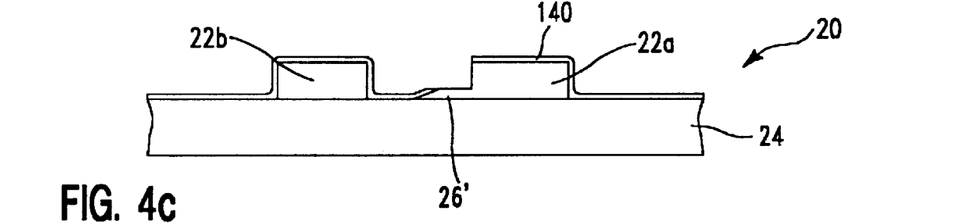

A FIB sputtering alternative to the etch and laser ablation processes described hereinabove will now be presented. FIGS. 1b and 3a show top and cross sectional views of defect 26 attached to chrome line 22a on quartz substrate 24 that will be repaired using FIB sputtering. First thin layer of copper 140 is sputter deposited on chromium-on-quartz mask 20, coating the entire surface of mask 20 including clear regions 27 of quartz substrate 24 and chrome lines 22a, 22b as shown in FIG. 4a. Gallium ions are then used in a FIB tool to sputter window 50 in copper coating 140 as shown in FIG. 4b. The sputtering continues until all but a thin layer of defect 26' is removed, as shown in FIG. 4c. Gallium that would otherwise have stained surrounding clear regions 27 of mask 20 instead strike copper coating 140 surrounding defect 26 and remaining layer of defect 26'. FIB sputtering is contained within defect 26 in patterns 52 as shown in top view in FIG. 4d so as to avoid staining surrounding clear regions 27 or damaging adjacent line 22a.

Figure 4D:
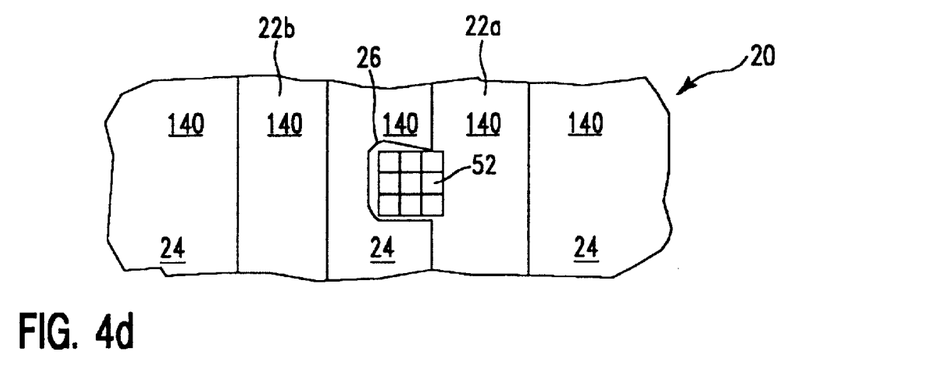
FIG. 4d is a top view of the step of FIG. 4c.
Figure 4E:
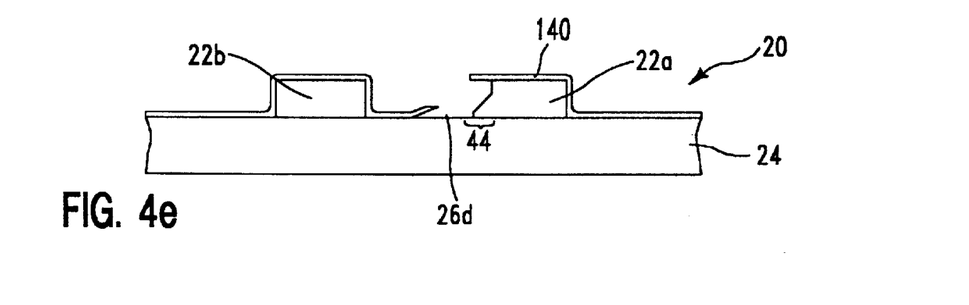

Finally, as shown in FIG. 4e, a chemical etch is used to remove thin layer of defect 26' while copper 140 protects protecting wanted chrome portions of mask 20 from etch in the chrome etchant. If the chemical etch is sufficiently brief no further repair will be necessary since undercutting of line 22a and creation of clear defect 44 with the brief etch will be negligible. It is also possible to take undercutting into account when doing the sputtering of copper coating 140 and defect 26. However, if sputtering or undercutting damages line 22a, as shown in FIGS. 4d and 4e, the deposition process described hereinbelow to repair clear defects can be used.

In an alternative to the brief etch step shown in FIG. 4e, thin layer of defect 26' of FIG. 4c can be laser ablated while copper coating 140 acts to protect clear regions 27 of mask 20 from ablation fallout. Then the copper coating is removed using dilute potassium hydroxide, tetramethylammonium hydroxide, or another dilute alkaline solution that etches copper without attacking chrome or quartz. Gallium stains on the copper coating from the FIB process and chromium fallout on the copper coating from laser ablation are lifted off when copper coating 140 is removed in the final step (not shown). As mentioned hereinabove, the present inventors have found that laser ablation of a thin layer of defect, as shown in FIG. 4c, does not cause quartz pitting.

The present inventors have found that copper has a sufficiently high secondary electron yield so that the chromium lines and the gold-carbon deposited in a FIB repair are all clearly distinguished in the ion bean In addition, the present inventors have found that layer of copper 140 having a thickness in the range 25 to 75 Å permits unexpectedly improved imaging of chromium line 22a, quartz substrate 24, and defect 26 with the ion beam. Chromium is clearly distinguished from quartz regions of the mask with this thin coating. The unexpectedly improved imaging is the result of a low level of charging of quartz as compared to chromium. It is also the result of differences in secondary electron yield from the two materials that are within ion range of the surface below the thin layer of copper. Thicker copper, up to about 400 Å can also be used but as the thickness of copper increases image contrast is seen to be degraded. Copper 140 with a thickness in the range 25 to 75 Å is sufficient to prevent gallium from reaching the quartz and staining clear regions 27 beneath defect 26.

Figure 5A:
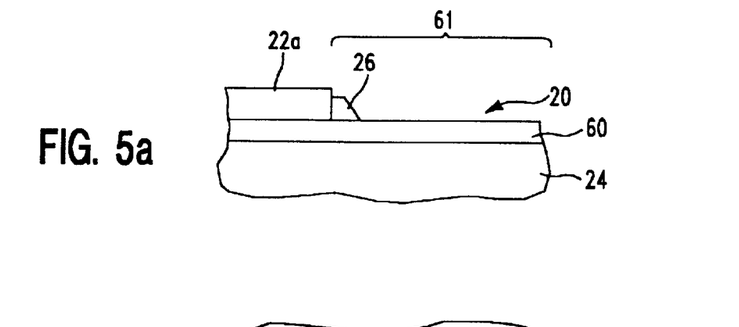
FIG. 5a is a cross sectional view of an opaque defect similar to the defect of FIG. 1b but on a carbon film on a quartz substrate.
Figure 5B:
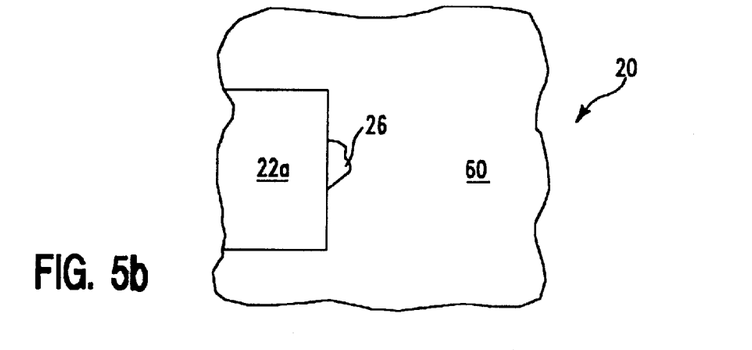
FIGS. 5b–5d are top views of the steps of repairing the opaque defect of FIG. 5a according to another laser ablation embodiment of the present invention.

In still another embodiment, shown in cross section in FIG. 5a and in top view in FIG. 5b, film 60 is provided on the quartz substrate before the chromium is deposited. Film 60 is a material that is selectively etchable with respect to quartz and chromium, such as carbon, polymers, many inorganic films, and metals, including copper. Film 60 can also be a layered structure including several materials. Carbon is preferred for film 60, as described hereinbelow. Film 60 is located beneath chrome line 22a and extends over clear regions 27 of quartz substrate 24. After patterning the blanket chromium to provide line 22a, film 60 remains on quartz substrate 24 under chromium line 22a and on clear regions 27 of quartz substrate 24 between chromium lines 22a. Also shown in FIGS. 5a–5b is opaque defect 26 attached to line 22a that also extends over film 60.

Figure 5C:
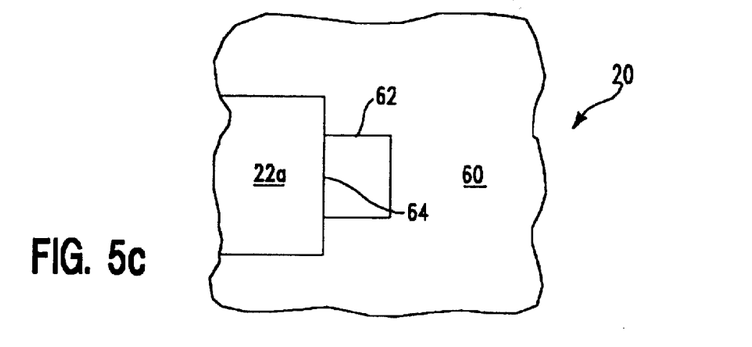
Figure 5D:
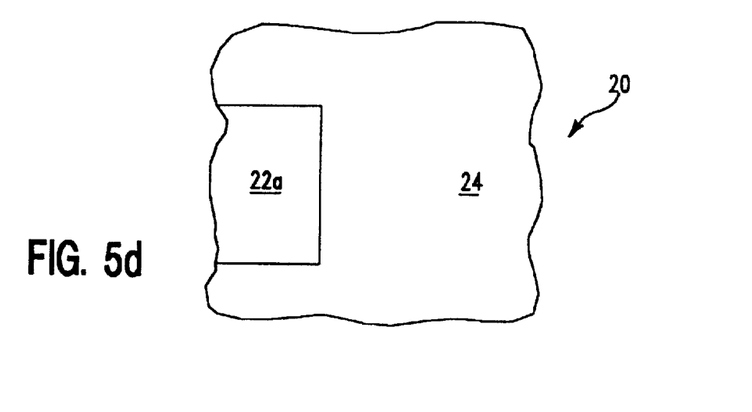

A standard laser repair process may now be used in which a laser ablation tool ablates defect 26 in rectangular region 62 adjacent edge 64 of chromium line 22a, as shown in FIG. 5c, while film 60 protects both underlying quartz 24 from pitting and neighboring clear regions 27 of mask 20 from fallout. Advantageously, because film 60 protects quartz substrate 24 from pitting damage during the laser ablation step, an etch step can be avoided even with a standard laser repair system. The entire defect can be laser ablated in a single laser ablation step. Because the etch step is avoided there is less damage to chrome line 22a as well. The ablation may leave carbon film 60 in place in rectangular region 62 or it may remove a portion of carbon film 60 from quartz substrate 24, leaving rectangular region 62 clear of both opaque defect 26 and film 60. In the next step, shown in FIG. 5d, the repair is completed by isotropically plasma etching carbon film 60 from mask 20, undercutting fallout. Fallout that was captured on carbon film 60 is then washed off the surface of the mask. Advantageously, if film 60 is not fully removed during the ablation step, several opaque defects in close proximity to each other can be repaired while avoiding degrading earlier repaired regions with fallout from later repaired regions.

Figure 6A:
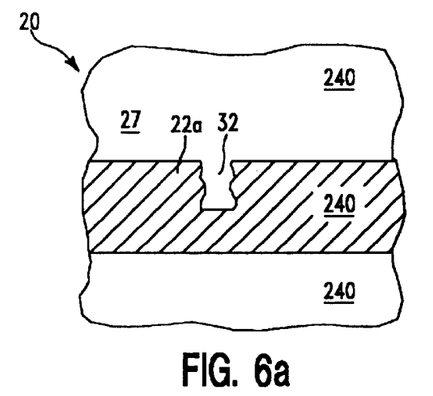
FIGS. 6a–6d are cross sectional views of the steps of repairing a clear defect according to either a laser deposition or FIB deposition embodiment of the present invention.
Figure 6B:
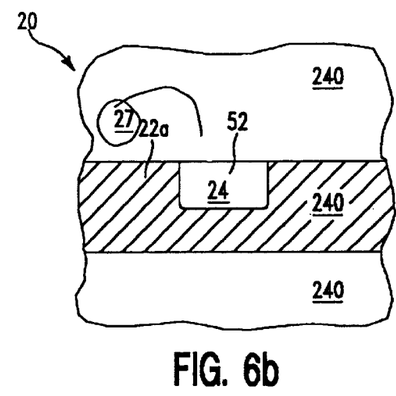
Figure 6C:
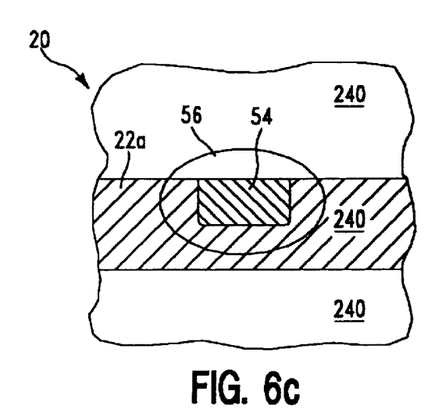
Figure 6D:
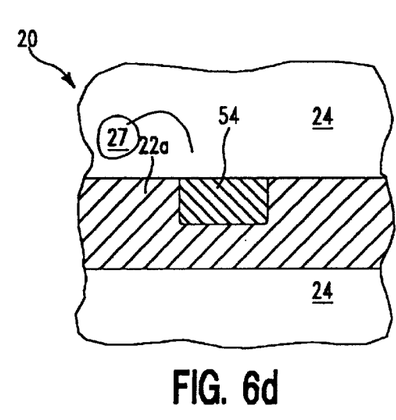

Steps for repairing clear defects either by laser or FIB deposition are shown in FIGS. 6a–6d. The clear defects may be original defects, like those shown in FIGS. 1d, 1e, and 1f. The clear defects may also be generated during opaque defect repair steps, such as etch or laser ablation, as shown in FIGS. 2b, 3d, and 4f. In the FIB repair process, first thin film conductive coating 240 is sputter deposited on quartz substrate 24 over chrome lines 24 and clear regions 27 of mask 20 there between. Conductive coating 240 will prevent charging of quartz substrate 24 and enhance imaging during the FIB process as described hereinabove. Coating 240 is formed of a thin layer of copper, titanium or another highly conductive material with high secondary electron yield that can be selectively removed without damaging chrome 22a or quartz 24. If coating 40 of FIGS. 2a or 3b is itself a conductive coating, it can be left in place. Similarly, coating 140 of FIG. 4f can also be left in place. However, best results will be obtained if new coating 240 is applied so as to coat all clear regions 27 adjacent to clear defect 44. After coating 240 has been deposited over the entire mask, it is ion sputtered over clear defect 32 or 44 in line 22a and over adjacent regions of line 22a to create enlarged clear defect 52 as shown in FIG. 6b. Coating 240 remains over adjacent clear regions 27 of mask 20 serving to protect these clear regions 27 from staining during FIB deposition to repair the clear defect. Opaque material 54, such as gold, is FIB deposited to fill in enlarged clear defect 52, as shown in FIG. 6c. Stain 56 from the deposition is deposited on coating 240 around enlarged clear defect 52. Conductive coating 240 and any stain 56 thereon is then removed from mask 20, leaving line 22a repaired, while adjacent clear regions 27 are left free of stain, as shown in FIG. 6d.

The present inventors have found that a conductive coating formed of copper has advantage during FIB deposition as well as during FIB sputtering. Conductive copper coating 140 or 240 permits better imaging and more accurate control over the ion beam than other coating materials during either sputtering or deposition. In addition, copper is easily removable without damaging either chromium or quartz.

In an alternative to FIB deposition, laser deposition can be used to fill original clear defect 32 (FIG. 1e) or clear defect 44 created in the process of repairing opaque defect 26 (FIGS. 2b, 3d, and 4f). Steps for the laser deposition repair of clear defects are also shown in the same FIGS. 6a–6d used to illustrate FIB repair. In the first step, coating 240 is deposited on mask 20 to protect mask 20 from laser ablation damage. Coating 240 can be a polymer, such as photoresist, a metal, such as copper, or a material, such as carbon that can be etched selective to mask materials, including chrome lines, quartz, and attenuator.

Next coating 240 and clear defect 32 or 44 are laser ablated to provide clear rectangular ablated region 52 around defect 32 as shown in FIG. 6b. A laser deposition process is then used to deposit material 54 in rectangular ablated region 52. Any laser deposition halo 56 of material deposited adjacent desired region 52 during the laser deposition process will fall on coating 240 rather than on bare quartz 24 as shown in FIG. 6c. Halo 56 is lifted off when selectively etchable coating 240 is etched as shown in FIG. 6d. A reactive ion etch or sputtering step can also be used to remove halo material from coating 240 before the etch step. Thus, more damaging process steps to remove halo 56 from clear regions 27 of mask 20, such as laser ablation, are avoided.

The processes described hereinabove can also be used to repair chromium bridge 21 (FIG. 1a). In this case, clear defects will likely be generated in both lines 22a and 22b, and these clear defects are then FIB or laser deposition repaired as described hereinabove. The processes can also be used to repair isolated chromium defect 28 (FIG. 1c). But in this case, there is no danger of producing a clear defect in an adjacent line, and therefore, no FIB or laser deposition repair step is likely to be needed.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of fabricating integrated circuits on a semiconductor wafer, comprising the steps of:
   (a) providing a semiconductor wafer;
   (b) providing a repaired mask, wherein the method of repairing said mask comprises the steps of:
      1. providing a transparent substrate comprising a surface having a first region and a second region, a light absorbing first material covering said first region and not covering said second region;
      2. inspecting said mask and detecting an opaque defect on said mask, said defect in a defect region; and
      3. shining a plurality of laser pulses on said opaque defect region to ablate said defect, said laser pulses having a pulse duration of less than 1 picoseconds, to remove said defect without substantially damaging said substrate underlying said defect; and
   (c) shining light through said repaired mask and exposing said wafer.

2. A method as recited in claim 1, further comprising before said shining step (b3.) the step of providing a second material on said substrate on said second region, said second material for temporary protection of said second region from fallout during said shining step (b3.), said second material selectively removable with respect to said first material and said substrate.

3. A method as recited in claim 1, wherein said laser pulses have a duration of less than 1 picosecond.

4. A method as recited in claim 1, wherein said laser pulses have a duration of less than 200 femtoseconds.

5. A method as recited in claim 1, wherein said laser pulses ablate said defect layer by layer.

6. A method as recited in claim 1, wherein no coating is provided on said substrate before said shining step (b3.).

7. A method as recited in claim 1, wherein in said shining step (b3.), said defect is removed without splattering defect material on said substrate.

8. A method as recited in claim 1, wherein in said shining step (b3.), said defect is removed without pitting said substrate under said defect.

9. A method as recited in claim 1, wherein said opaque defect comprises chrome or molybdenum.

10. A method as recited in claim 1, wherein said substrate is transparent and has a transmittance in regions not laser treated, said substrate having a transmittance under said removed material that is within 5% of said transmittance in said untreated regions.

11. A method as recited in claim 10, wherein said transmittance under said removed material is within 2% of said transmittance in said untreated regions.

* * * * *